United States Patent
Honda et al.

(10) Patent No.: US 6,753,707 B2
(45) Date of Patent: Jun. 22, 2004

(54) DELAY CIRCUIT AND SEMICONDUCTOR DEVICE USING THE SAME

(75) Inventors: Takashi Honda, Tokyo (JP); Ken Nozaki, Miyazaki (JP)

(73) Assignee: Oki Electric Industry CO, Ltd., Tokyo (JP)

( * ) Notice: Subject to any disclaimer, the term of this patent is extended or adjusted under 35 U.S.C. 154(b) by 0 days.

(21) Appl. No.: 10/115,034

(22) Filed: Apr. 4, 2002

(65) Prior Publication Data

US 2003/0189452 A1 Oct. 9, 2003

(51) Int. Cl.$^7$ ................................................ H03K 3/00
(52) U.S. Cl. ..................... 327/108; 327/210; 327/391; 327/392; 326/24; 326/87
(58) Field of Search .................... 327/108, 111, 327/112, 344, 210, 391, 392, 551, 558, 263, 264, 272, 278, 283, 285; 326/22, 24, 82, 84–87

(56) References Cited

U.S. PATENT DOCUMENTS

| | | | | |
|---|---|---|---|---|
| 5,023,472 A | * | 6/1991 | Hasimoto et al. | ........... 327/108 |
| 5,120,992 A | * | 6/1992 | Miller et al. | ................. 327/111 |
| 5,355,028 A | * | 10/1994 | O'Toole | ....................... 326/83 |
| 5,357,211 A | * | 10/1994 | Bryson et al. | .............. 330/263 |
| 5,550,501 A | * | 8/1996 | Ito et al. | ..................... 327/374 |
| 5,907,254 A | * | 5/1999 | Chang | ......................... 327/165 |
| 6,198,334 B1 | * | 3/2001 | Tomope et al. | ............. 327/391 |
| 6,400,176 B1 | * | 6/2002 | Griffin et al. | ................. 326/30 |
| 6,462,597 B2 | * | 10/2002 | Lee | ............................ 327/261 |

FOREIGN PATENT DOCUMENTS

JP    02-017717    1/1990

* cited by examiner

*Primary Examiner*—Timothy P. Callahan
*Assistant Examiner*—An T. Luu
(74) *Attorney, Agent, or Firm*—Rabin & Berdo, P.C.

(57) ABSTRACT

A delay circuit includes an output circuit including first and second output elements. The first and second output elements are connected serially between a first power supply source and a second power supply source. The delay circuit further includes a delay element, which is coupled between a first input circuit and an output circuit to generate a first control signal that is delayed with respect to the input signal. The delay circuit still further includes a first node coupled between the delay element and one of the first and second output elements; and a second node, coupled to the other output elements to supply a second control signal having substantially no delay with respect to the input signal.

13 Claims, 8 Drawing Sheets

US 6,753,707 B2

DELAY CIRCUIT AND SEMICONDUCTOR DEVICE USING THE SAME

TECHNICAL FIELD OF THE INVENTION

This invention relates to a delay circuit used in a semiconductor device.

BACKGROUND OF THE INVENTION

A delay circuit is designed to produce an output signal that is delayed intentionally with respect to an input signal. A conventional delay circuit includes a plurality of inverters, which are serially connected between an input terminal and an output terminal. Another conventional delay circuit includes a resistor and a capacitor, which are connected between an input terminal and an output terminal.

According to conventional delay circuits, a delay time may not be uniform. Further, a through-current or leak current is generated, and as a result, it is difficult to decrease a power consumption.

OBJECTS OF THE INVENTION

Accordingly, an object of the present invention is to provide a delay circuit, which produces a respected delay time reliably.

Another object of the present invention is to provide a delay circuit, in which the amount of through-current or leak current flowing through an output circuit is reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a delay circuit includes a first input circuit, which receives an input signal; and an output circuit which comprises first and second output elements to supply an output signal. The first and second output elements are connected serially between a first power supply source and a second power supply source. The delay circuit further includes a delay element, which is coupled between the input circuit and output circuit to generate a first control signal that is delayed with respect to the input signal. The delay circuit still further includes a first node coupled between the delay element and one of the first and second output elements; and a second node which is coupled to the other output elements to supply a second control signal having substantially no delay with respect to the input signal.

According to the present invention, the control gate is turned off even if the delay node is at an intermediate level, so that a respected delay time can be provided reliably. Further, the amount of leak current or through-current flowing through the output circuit is reduced.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
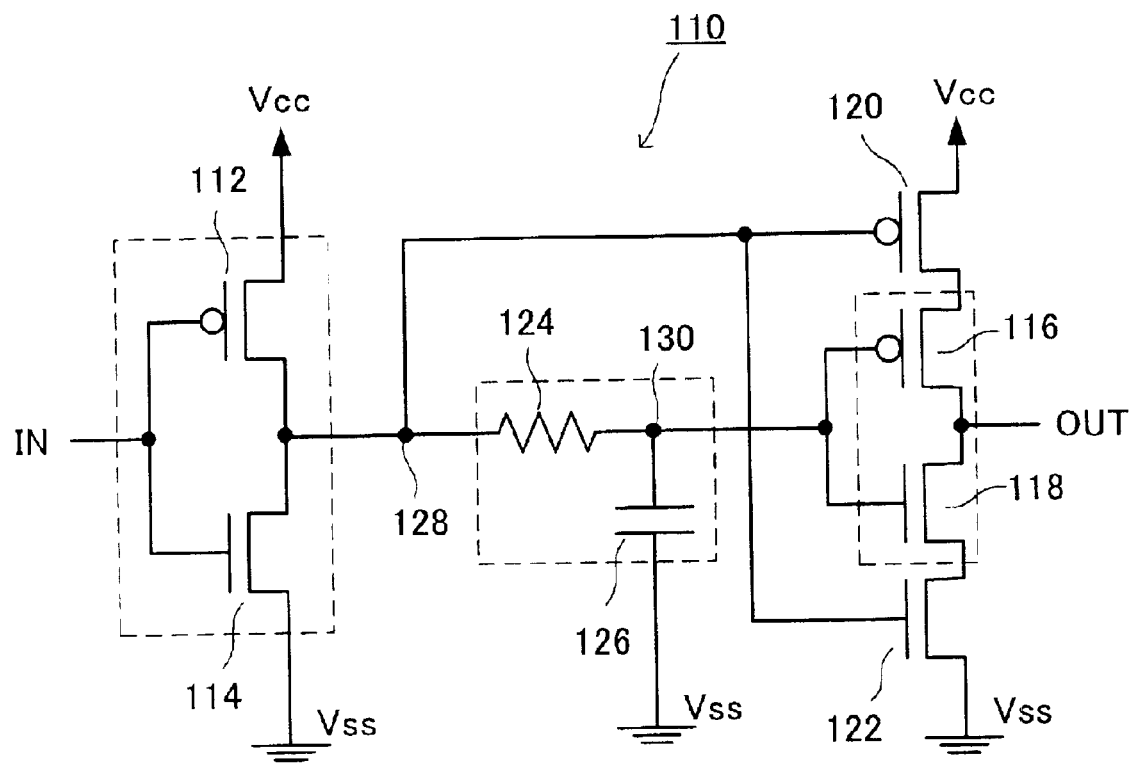
FIG. 1 is a circuit diagram showing a delay circuit according to a first preferred embodiment of the present invention.

FIG. 1 is a circuit diagram showing a delay circuit 110 according to a first preferred embodiment of the present invention. The delay circuit 110 and other delay circuits 210, 310, 410, 510 and 610, described later, are formed as a part of a semiconductor device. The delay circuit 110 includes a first input circuit (112, 114); an output circuit (116, 118); a delay element (124, 126); a delay node 130; a non-delay node 128; and a control gate (120, 122).

The first input circuit includes a first PMOS transistor 112 and a first NMOS transistor 114 to receive an input signal. The first PMOS transistor 112 and first NMOS transistor 114 function as an inverter. Gates of the first PMOS and first NMOS transistors 112 and 114 are supplied with an input signal IN. Drain and source of the first PMOS transistor 112 are connected to a first power supply source Vcc and the non-delay node 128, respectively. Drain and source of the first NMOS transistor 114 are connected to the non-delay node 128 and a second power supply source Vss, respectively.

The output circuit (116, 118) supplies an output signal. The output circuit includes a second PMOS transistor 116 and a second NMOS transistor 118. The second PMOS transistor 116 and second NMOS transistor 118 function as an inverter. Gates of the second PMOS and second NMOS transistors 116 and 118 are connected to the delay node 130. A source of the second PMOS transistor 116 and a drain of the second NMOS transistor 118 are connected to an output terminal.

The delay element (124, 126) is connected between the non-delay node 128 and the delay node 130 to generate a first control signal that is delayed with respect to the input signal IN. The delay element includes a resistor 124 and a capacitor 126. The resistor 124 is connected between the non-delay node 128 and delay node 130. The capacitor is connected between the delay node 130 and the second power supply source Vss. The non-delay node 128 supplies a second control signal having substantially no delay with respect to the input signal IN.

The control gate includes a third PMOS transistor 120 and a third NMOS transistor 122, gates of which are connected to the non-delay node 128. Drain and source of the third PMOS transistor 120 are connected to the first power supply source Vcc and a drain of the second PMOS transistor 116, respectively. Drain and source of the third NMOS transistor 122 are connected to a source of the second NMOS transistor 118 and the second power supply source Vss, respectively. One of the third PMOS and third NMOS transistors 120 and 122 is turned off while the delay node 130 is at an intermediate level.

Figure 2:
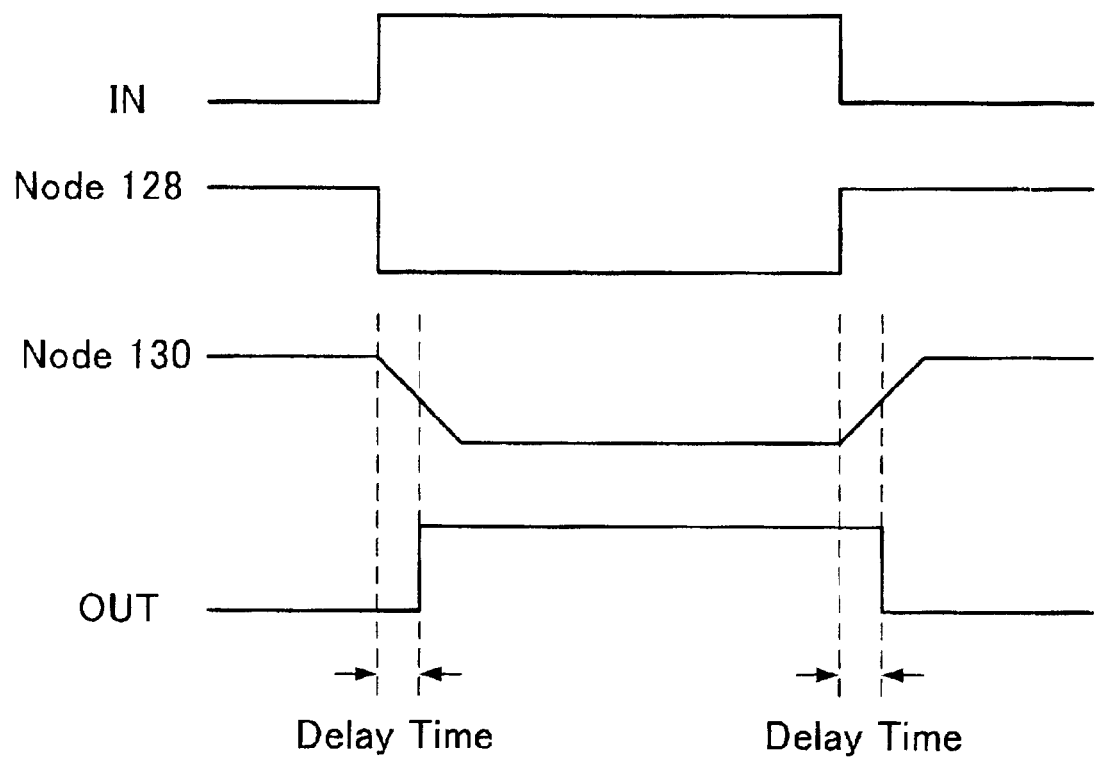
FIG. 2 is a timing chart showing the operation of the first preferred embodiment, shown in FIG. 1.

FIG. 2 is a timing chart showing the operation of the first preferred embodiment, shown in FIG. 1. When the input signal IN is at low level (Vss), the first PMOS transistor 112 is on state and the first NMOS transistor 114 is off state. Both of the non-delay node 128 and delay node 130 are at high level (Vcc). The second and third PMOS transistors 116 and 120 are off, while the second and third NMOS transistors 118 and 122 are on.

Next, when the input signal IN of high level is inputted, the non-delay node 128 is turned high to low completely. The voltage level of the node 130, which is defined by the time constant of the resistor 124 and capacitor 126, is gradually decreased to the low level. As a result, the NMOS 118 is gradually turned off, and the PMOS 116 is gradually turned on. An output signal OUT at high level is outputted.

When the first control signal at the delay node 130 is at an intermediate level, the second PMOS and second NMOS transistors 116 and 118 may be turned on at the same time. Even if the second PMOS and second NMOS transistors 116 and 118 are turned on simultaneously, no through-current or leak-current would be flowing, because the third NMOS transistor 122 has been turned off.

On the other hand, when the input signal IN is at high level (Vcc), the first PMOS transistor 112 is off state and the first NMOS transistor 114 is on state. Both of the non-delay node 128 and delay node 130 are at low level (Vss). The second and third PMOS transistors 116 and 120 are on while the second and third NMOS transistors 118 and 122 are off.

Next, when the input signal IN of high level is inputted, the non-delay node 128 is turned high to low completely. The voltage level of the node 130, which is defined by the time constant of the resistor 124 and capacitor 126, is gradually decreased to the low level. As a result, the NMOS 118 is gradually turned off, and the PMOS 116 is gradually turned on.

When the first control signal at the delay node 130 is at an intermediate level, the second PMOS and second NMOS transistors 116 and 118 may be turned on at the same time. Even if the second PMOS and second NMOS transistors 116 and 118 are turned on simultaneously, no through-current or leak-current would be flowing, because the third PMOS transistor 120 has been turned off.

Figure 3:
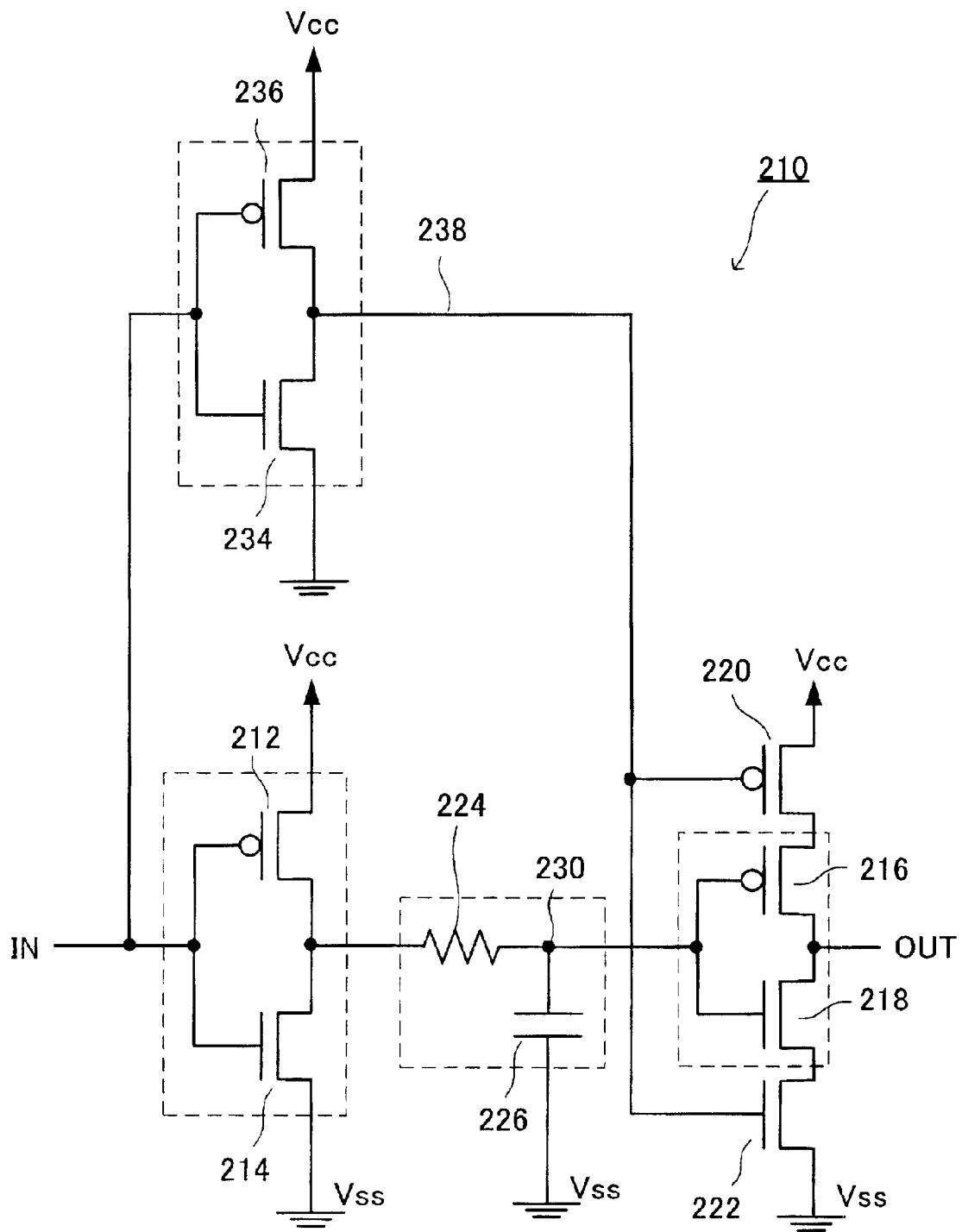
FIG. 3 is a circuit diagram showing a delay circuit according to a second preferred embodiment of the present invention.

FIG. 3 is a circuit diagram showing a delay circuit 210 according to a second preferred embodiment of the present invention. The delay circuit 210 includes a first input circuit (212, 214); a second input circuit (234, 236); an output circuit (216, 218); a delay element (224, 226); a delay node 230; a non-delay node 238; and a control gate (220, 222).

The first input circuit includes a first PMOS transistor 212 and a first NMOS transistor 214 to receive an input signal.

The first PMOS transistor 212 and first NMOS transistor 214 function as an inverter. Gates of the first PMOS and first NMOS transistors 212 and 214 are supplied with an input signal IN. A drain of the first PMOS transistor 212 is connected to a first power supply source Vcc. Drain and source of the first NMOS transistor 214 are connected to a source of the first PMOS transistor 212 and a second power supply source Vss, respectively.

The second input circuit includes a fourth PMOS transistor 236 and a fourth NMOS transistor 234 to receive an input signal. The fourth PMOS transistor 236 and fourth NMOS transistor 234 function as an inverter. Gates of the fourth PMOS and fourth NMOS transistors 236 and 234 are supplied with an input signal IN. Drain and source of the fourth PMOS transistor 236 are connected to the first power supply source Vcc and non-delay node 238, respectively. Drain and source of the fourth NMOS transistor 234 are connected to the non-delay node 238 and second power supply source Vss, respectively. The non-delay node 238 supplies a second control signal having substantially no delay with respect to the input signal IN.

The output circuit (216, 218) supplies an output signal OUT. The output circuit includes a second PMOS transistor 216 and a second NMOS transistor 218. The second PMOS transistor 216 and second NMOS transistor 218 function as an inverter. Gates of the second PMOS and second NMOS transistors 216 and 218 are connected to the delay node 230. A source of the second PMOS transistor 216 and a drain of the second NMOS transistor 218 are connected to an output terminal.

An input terminal of the delay element (224, 226) is commonly connected to the source of the first PMOS transistor 212 and the drain of the first NMOS transistor 214. An output terminal of the delay element (224, 226) is connected to the delay node 230 to generate a first control signal that is delayed with respect to the input signal IN. The delay element includes a resistor 224 and a capacitor 226. One end of the resistor 224 is commonly connected to the source of the first PMOS transistor 212 and the drain of the first NMOS transistor 214. The other end of the resistor 224 is connected to the delay node 230. The capacitor 226 is connected between the delay node 230 and the second power supply source Vss.

The control gate includes a third PMOS transistor 220 and a third NMOS transistor 222, gates of which are connected to the non-delay node 238. Drain and source of the third PMOS transistor 220 are connected to the first power supply source Vcc and a drain of the second PMOS transistor 216, respectively. Drain and source of the third NMOS transistor 222 are connected to a source of the second NMOS transistor 218 and the second power supply source Vss, respectively.

Next, the operation of the second preferred embodiment will be described referring again to FIG. 2. When the input signal IN is at low level (Vss), the first PMOS transistor 212 is on state and the first NMOS transistor 214 is off state. Both of the non-delay node 238 and delay node 230 are at high level (Vcc). The second and third PMOS transistors 216 and 220 are on, while the second and third NMOS transistors 218 and 222 are off.

Next, when the input signal IN is changing low to high, the non-delay node 238 is turned to low immediately, and as a result, the third NMOS transistor 222 is turned off and the third PMOS transistor 220 is turned on. After that, when the level of the first control signal at the delay node 230 is falling lower to a threshold level of the first NMOS transistor 214, the first NMOS transistor 214 is turned on and the delay node 230 is turned to low. In response to the low level of the first control signal at the delay node 230, the second PMOS transistor 216 and second NMOS transistor 218 are turned on and off, respectively; and as a result, an output signal OUT at high level is outputted.

When the first control signal at the delay node 230 is at an intermediate level, the second PMOS and second NMOS transistors 216 and 218 may be turned on at the same time. Even if the second PMOS and second NMOS transistors 216 and 218 are turned on simultaneously, no through-current or leak-current would be flowing, because the third NMOS transistor 222 has been turned off.

On the other hand, when the input signal IN is at high level (Vcc), the first PMOS transistor 212 is off state and the first NMOS transistor 214 is on state. Both of the non-delay node 238 and delay node 230 are at low level (Vss). The second and third PMOS transistors 216 and 220 are off, while the second and third NMOS transistors 218 and 222 are on.

Next, when the input signal IN is changing high to low, the non-delay node 238 is turned to high immediately, and as a result, the third NMOS transistor 222 is turned on and the third PMOS transistor 220 is turned off. After that, when the level of the first control signal at the delay node 230 is rising higher to a threshold level of the first PMOS transistor 212, the first PMOS transistor 212 is turned on and the delay node 230 is turned to high. In response to the high level of the first control signal at the delay node 230, the second PMOS transistor 216 and second NMOS transistor 218 are turned off and on, respectively; and as a result, an output signal OUT at low level is outputted.

When the first control signal at the delay node 230 is at an intermediate level, the second PMOS and second NMOS transistors 216 and 218 may be turned on at the same time. Even if the second PMOS and second NMOS transistors 216 and 218 are turned on simultaneously, no through-current or leak-current would be flowing, because the third PMOS transistor 220 has been turned off.

Figure 4:
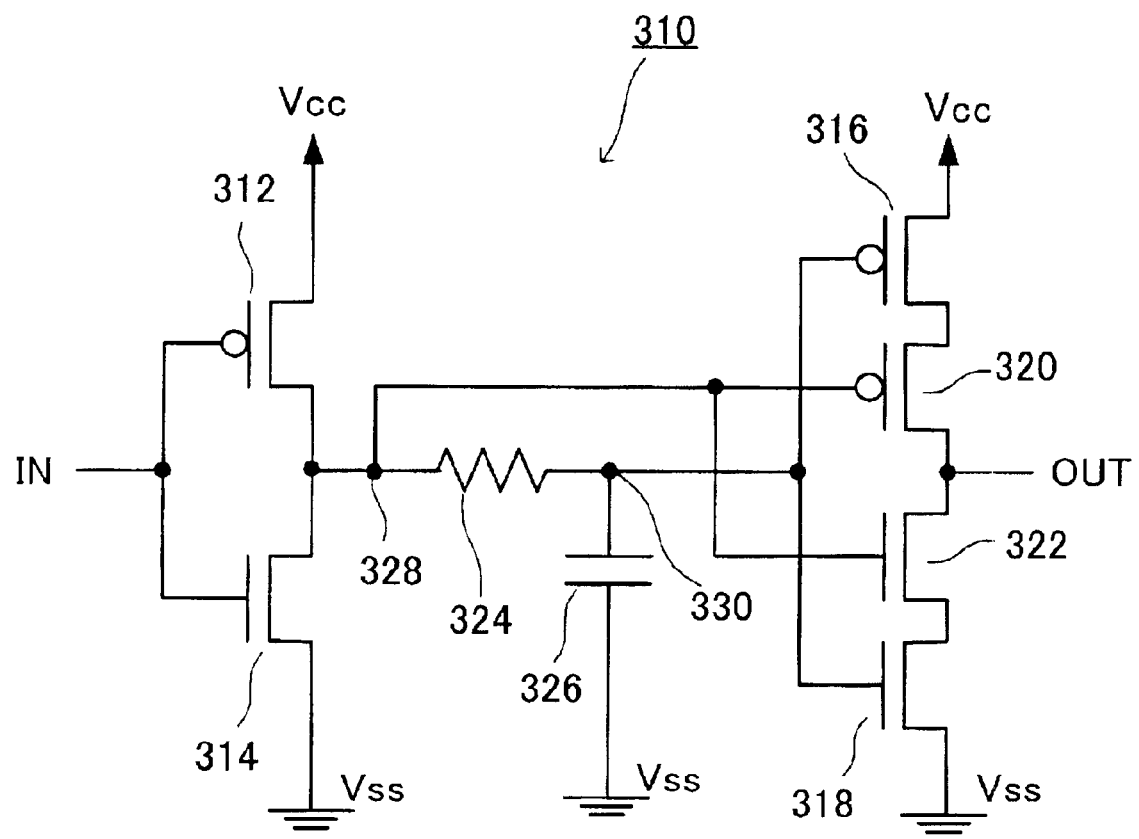
FIG. 4 is a circuit diagram showing a delay circuit according to a third preferred embodiment of the present invention.

FIG. 4 is a circuit diagram showing a delay circuit 310 according to a third preferred embodiment of the present invention. The delay circuit 310 includes a first input circuit (312, 314); an output circuit (316, 318); a delay element (324, 326); a delay node 330; a non-delay node 328; and a control gate (320, 322).

The first input circuit includes a first PMOS transistor 312 and a first NMOS transistor 314 to receive an input signal. The first PMOS transistor 312 and first NMOS transistor 314 function as an inverter. Gates of the first PMOS and first NMOS transistors 312 and 314 are supplied with an input signal IN. Drain and source of the first PMOS transistor 312 are connected to a first power supply source Vcc and the non-delay node 328, respectively. Drain and source of the first NMOS transistor 314 are connected to the non-delay node 328 and a second power supply source Vss, respectively.

The output circuit (316, 318) supplies an output signal. The output circuit includes a second PMOS transistor 316 and a second NMOS transistor 318. The second PMOS transistor 316 and second NMOS transistor 318 function as an inverter. Gates of the second PMOS and second NMOS transistors 316 and 318 are connected to the delay node 330. A drain of the second PMOS transistor 316 is connected to the first power supply source. A source of the second NMOS transistor 318 is connected to the second power supply source Vss.

The control gate includes a third PMOS transistor 320 and a third NMOS transistor 322, gates of which are connected to the non-delay node 328. A source of the third PMOS transistor 320 and a drain of the third NMOS transistor 322 are commonly connected to the output terminal. A drain of the third PMOS transistor 320 is connected to a source of the second PMOS transistor 316. A source of the third NMOS transistor 320 is connected to a drain of the second NMOS transistor 318. One of the third PMOS and third NMOS transistors 320 and 322 is turned off while the delay node 330 is at an intermediate level.

The delay element (324, 326) is connected between the non-delay node 328 and the delay node 330 to generate a first control signal that is delayed with respect to the input signal IN. The delay element includes a resistor 324 and a capacitor 326. The resistor 324 is connected between the non-delay node 328 and delay node 330. The capacitor 326 is connected between the delay node 330 and the second power supply source Vss. The non-delay node 328 supplies a second control signal having substantially no delay with respect to the input signal IN.

Next, the operation of the third preferred embodiment will be described referring again to FIG. 2. When the input signal IN is at low level (Vss), the first PMOS transistor 312 is on state and the first NMOS transistor 314 is off state. Both of the non-delay node 328 and delay node 330 are at high level (Vcc). The second and third PMOS transistors 316 and 320 are on, while the second and third NMOS transistors 318 and 322 are off.

Next, when the input signal IN is changing low to high, the non-delay node 328 is turned to low immediately, and as a result, the third NMOS transistor 322 is turned off and the third PMOS transistor 320 is turned on. After that, when the level of the first control signal at the delay node 330 is falling lower to a threshold level of the first NMOS transistor 314, the first NMOS transistor 314 is turned on and the delay node 330 is turned to low. In response to the low level of the first control signal at the delay node 330, the second PMOS transistor 316 and second NMOS transistor 318 are turned on and off, respectively; and as a result, an output signal OUT at high level is outputted.

When the first control signal at the delay node 330 is at an intermediate level, the second PMOS and second NMOS transistors 316 and 318 may be turned on at the same time. Even if the second PMOS and second NMOS transistors 316 and 318 are turned on simultaneously, no through-current or leak-current would be generated, because the third NMOS transistor 322 has been turned off.

On the other hand, when the input signal IN is at high level (Vcc), the first PMOS transistor 312 is off state and the first NMOS transistor 314 is on state. Both of the non-delay node 328 and delay node 330 are at low level (Vss). The second and third PMOS transistors 316 and 320 are off, while the second and third NMOS transistors 318 and 322 are on.

Next, when the input signal IN is changing high to low, the non-delay node 328 is turned to high immediately, and as a result, the third NMOS transistor 322 is turned on and the third PMOS transistor 320 is turned off. After that, when the level of the first control signal at the delay node 330 is rising higher to a threshold level of the first PMOS transistor 312, the first PMOS transistor 312 is turned on and the delay node 330 is turned to high. In response to the high level of the first control signal at the delay node 330, the second PMOS transistor 316 and second NMOS transistor 318 are turned off and on, respectively; and as a result, an output signal OUT at low level is outputted.

When the first control signal at the delay node 330 is at an intermediate level, the second PMOS and second NMOS transistors 316 and 318 may be turned on at the same time. Even if the second PMOS and second NMOS transistors 316 and 318 are turned on simultaneously, no through-current or leak-current would be generated, because the third PMOS transistor 320 has been turned off.

Figure 5:
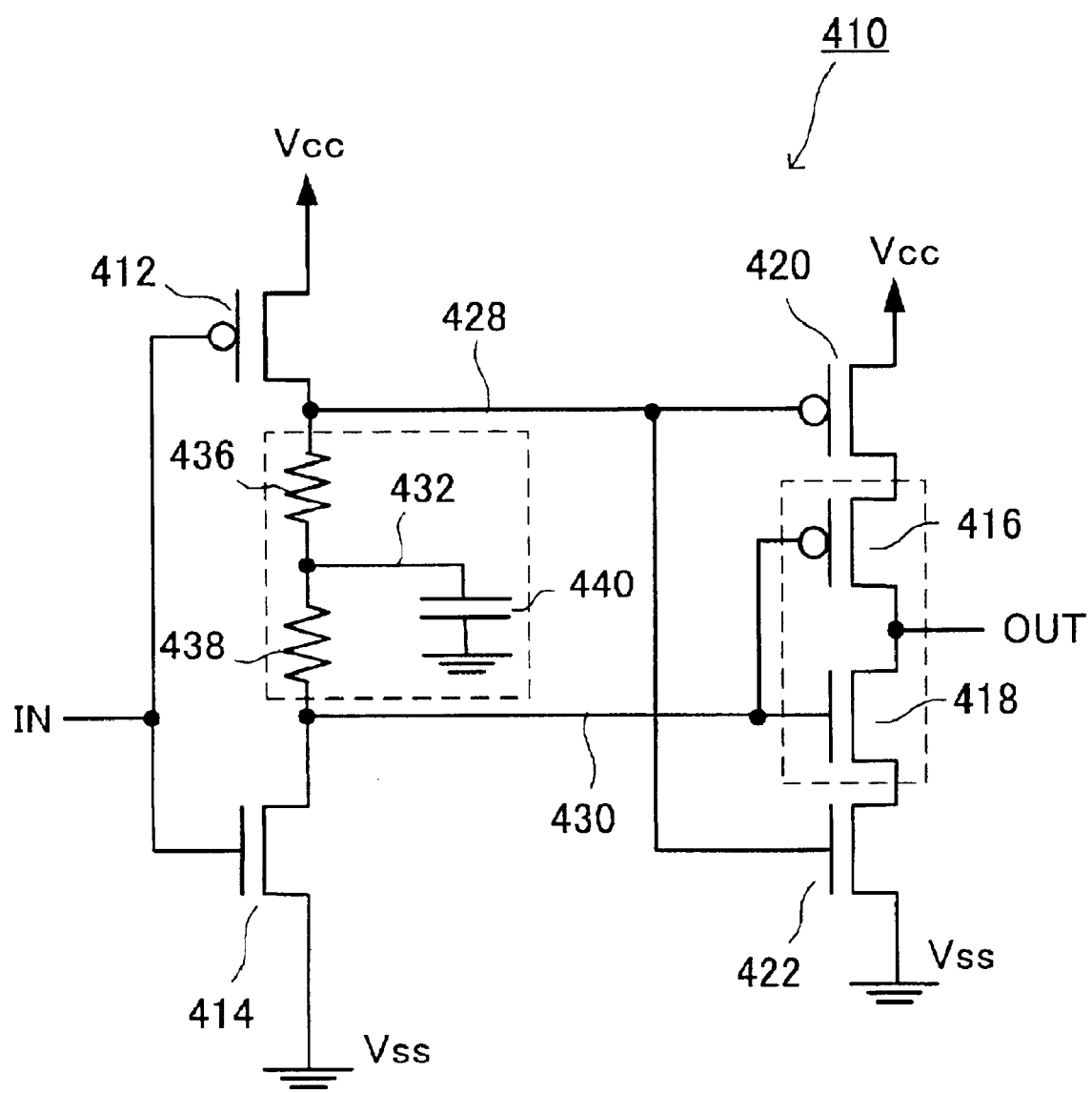
FIG. 5 is a circuit diagram showing a delay circuit according to a fourth preferred embodiment of the present invention.

FIG. 5 is a circuit diagram showing a delay circuit 410 according to a fourth preferred embodiment of the present invention. The delay circuit 410 includes a first input circuit (412, 414); an output circuit (416, 418, 420, 422); a delay element (436, 438, 440); and first to third nodes 428, 430 and 432. As compared to the above-described first to third embodiments, the first node 428 functions as a delay node when an input signal IN is changing low to high, and as a non-delay node when the input signal IN is changing high to low. On the other hand, the second node 430 functions as a delay node when an input signal IN is changing high to low, and as a non-delay node when the input signal IN is changing low to high.

The input circuit includes a first PMOS transistor 412 and a first NMOS transistor 414 to receive an input signal. The first PMOS transistor 412 and first NMOS transistor 414 function as an inverter. Gates of the first PMOS and first NMOS transistors 412 and 414 are supplied with an input signal IN. Drain and source of the first PMOS transistor 412 are connected to a first power supply source Vcc and the first node 428, respectively. Drain and source of the first NMOS transistor 414 are connected to the second node 430 and a second power supply source Vss, respectively.

The output circuit (416, 418, 420, 422) supplies an output signal OUT. The output circuit includes second and third PMOS transistors 416 and 420, and second and third NMOS transistor 418 and 422. The second PMOS transistor 416 and second NMOS transistor 418 form a first output element functioning as an inverter. The third PMOS transistor 420 and third NMOS transistor 422 form a second output element functioning as an inverter. Gates of the second PMOS and second NMOS transistors 416 and 418 are connected to the second node 430. A source of the second PMOS transistor 416 and a drain of the second NMOS transistor 418 are connected to an output terminal.

Gates of the third PMOS and third NMOS transistors 420 and 422 are connected to the first node 428. Drain and source of the third PMOS transistor 420 are connected to the first power supply source Vcc and a drain of the second PMOS transistor 416, respectively. Drain and source of the third NMOS transistor 422 are connected to a source of the second NMOS transistor 418 and the second power supply source Vss, respectively.

The delay element (436, 438, 440) is connected between the first node 428 and the second node 430 to generate a first control signal that is delayed with respect to the input signal IN. The delay element includes serially connected resistors 436 and 438, and a capacitor 440. The capacitor 440 is connected between the third node 432 and the second power supply source Vss.

Figure 6:
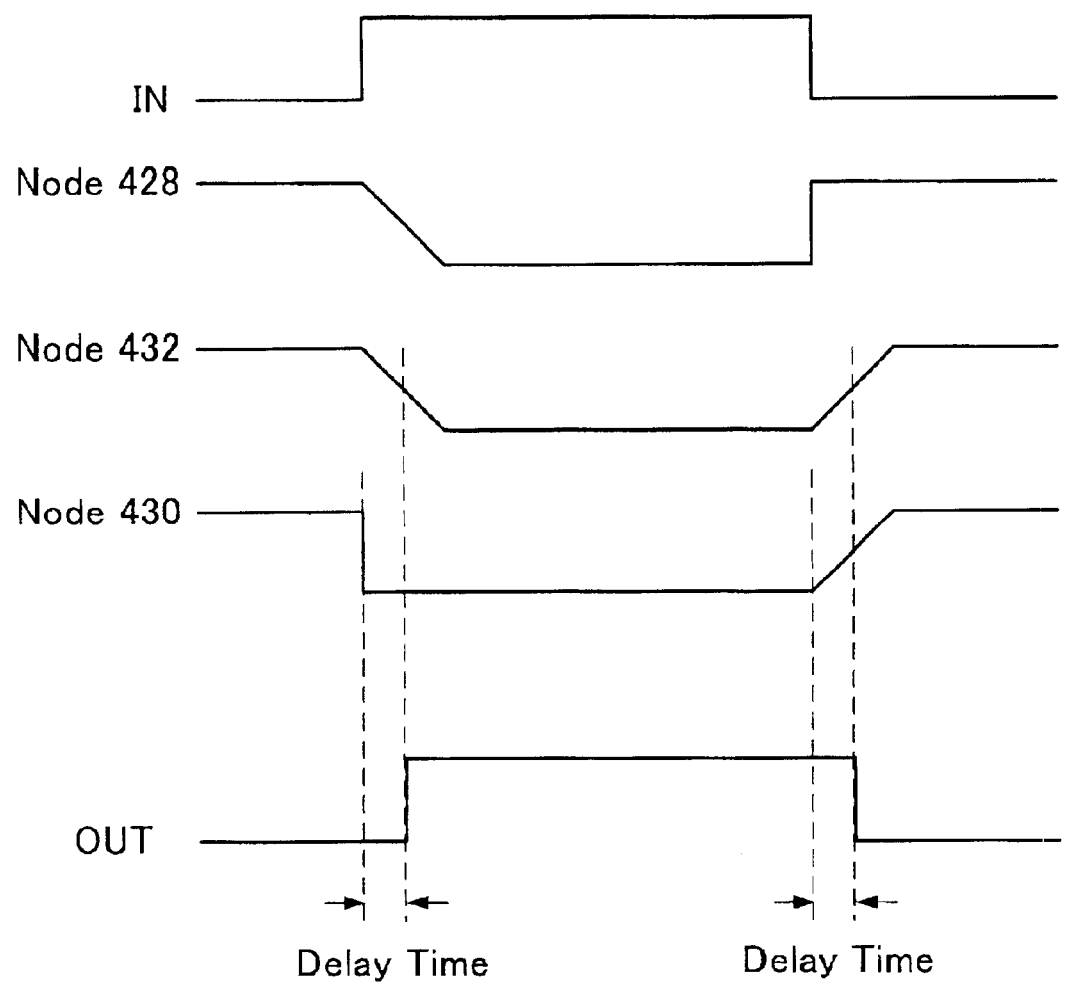
FIG. 6 is a timing chart showing the operation of the fourth preferred embodiment, shown in FIG. 5.

FIG. 6 is a timing chart showing the operation of the fourth preferred embodiment, shown in FIG. 5. When the input signal IN is at low level (Vss), the first PMOS transistor 412 is on state and the first NMOS transistor 414 is off state. All of the first to third nodes 428, 430 and 432 are at high level (Vcc). The second and third PMOS transistors 416 and 420 are off, while the second and third NMOS transistors 418 and 422 are on.

Next, when the input signal IN is changing low to high, the second node 430 is turned to low immediately or with a small period of delay, and as a result, the second NMOS transistor 418 is turned off and the second PMOS transistor 416 is turned on. After a certain period of delay time, the first and third nodes 428 and 432 are turned to low. When the first node 428 is turned to low, the PMOS transistor 420 is turned on and the NMOS transistor 422 is turned off. As a result, an output signal OUT at high level is outputted.

When the first node 428 is at an intermediate level, the PMOS and NMOS transistors 420 and 422 may be turned on at the same time. Even if the PMOS and NMOS transistors 420 and 422 are turned on simultaneously, no through-current or leak-current would be generated, because the NMOS transistor 418 has been turned off.

On the other hand, when the input signal IN is at high level (Vcc), the first PMOS transistor 412 is off state and the first NMOS transistor 414 is on state. All of the first to third nodes 428, 430 and 432 are at low level (Vss). The second and third PMOS transistors 416 and 420 are on, while the second and third NMOS transistors 418 and 422 are off.

Next, when the input signal IN is changing high to low, the first node 428 is turned to high immediately or with a small period of delay, and as a result, the NMOS transistor 422 is turned on and the PMOS transistor 420 is turned off. After a certain period of delay time, the second and third nodes 430 and 432 are turned to high. When the second node 430 is turned to high, the PMOS transistor 416 is turned off and the NMOS transistor 418 is turned on. As a result, an output signal OUT at low level is outputted.

When the second node 430 is at an intermediate level, the PMOS and NMOS transistors 416 and 418 may be turned on at the same time. Even if the PMOS and NMOS transistors 416 and 418 are turned on simultaneously, no through-current or leak-current would be generated, because the PMOS transistor 420 has been turned off.

Figure 7:
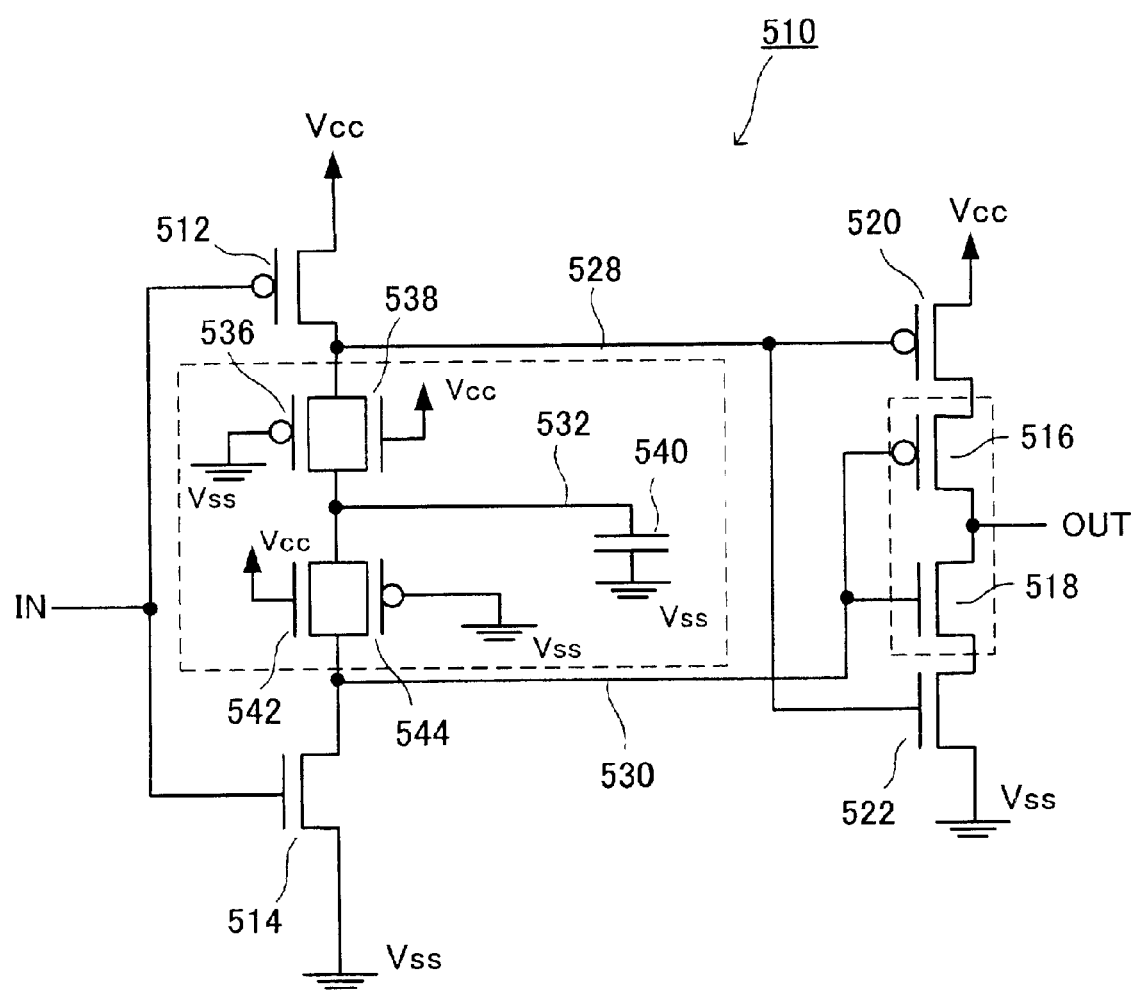
FIG. 7 is a circuit diagram showing a delay circuit according to a fifth preferred embodiment of the present invention.

FIG. 7 is a circuit diagram showing a delay circuit 510 according to a fifth preferred embodiment of the present invention. The delay circuit 510 includes an input circuit (512, 514); an output circuit (516, 518, 520, 522); a delay element (536, 538, 540, 542, 544); and first to third nodes 528, 530 and 532. As compared to the above-described first to third embodiments, the first node 528 functions as a delay node when an input signal IN is changing low to high, and as a non-delay node when the input signal IN is changing high to low. On the other hand, the second node 530 functions as a delay node when an input signal IN is changing high to low, and as a non-delay node when the input signal IN is changing low to high.

The first input circuit includes a first PMOS transistor 512 and a first NMOS transistor 514 to receive an input signal. The first PMOS transistor 512 and first NMOS transistor 514 function as an inverter. Gates of the first PMOS and first NMOS transistors 512 and 514 are supplied with an input signal IN. Drain and source of the first PMOS transistor 512 are connected to a first power supply source Vcc and the first node 528, respectively. Drain and source of the first NMOS transistor 514 are connected to the second node 530 and a second power supply source Vss, respectively.

The output circuit (416, 418, 420, 422) supplies an output signal OUT. The output circuit includes second and third PMOS transistors 516 and 520, and second and third NMOS transistor 518 and 522. The second PMOS transistor 516 and second NMOS transistor 518 form a first output element functioning as an inverter. The third PMOS transistor 520 and third NMOS transistor 522 form a second output element functioning as an inverter. Gates of the second PMOS and second NMOS transistors 516 and 518 are connected to the second node 530. A source of the second PMOS transistor 516 and a drain of the second NMOS transistor 518 are connected to an output terminal.

Gates of the third PMOS and third NMOS transistors 520 and 522 are connected to the first node 528. Drain and source of the third PMOS transistor 520 are connected to the first power supply source Vcc and a drain of the second PMOS transistor 516, respectively. Drain and source of the third NMOS transistor 522 are connected to a source of the second NMOS transistor 518 and the second power supply source Vss, respectively.

The delay element (536, 538, 540, 542, 544) is connected between the first node 528 and the second node 530 to generate a first control signal that is delayed with respect to the input signal IN. The delay element includes PMOS transistors 536 and 544, NMOS transistors 538 and 542 and a capacitor 540. The capacitor 540 is connected between the third node 532 and the second power supply source Vss. Gate, drain and source of the PMOS transistor 536 are connected to the second power supply source Vss, the first node 528 and third node 532, respectively. Gate, drain and source of the NMOS transistor 538 are connected to the first power supply source Vcc, the first node 528 and third node 532, respectively. Gate, drain and source of the PMOS transistor 544 are connected to the second power supply source Vss, the third node 532 and second node 530, respectively. Gate, drain and source of the NMOS transistor 542 are connected to the first power supply source Vcc, the third node 532 and second node 530, respectively.

Next, the operation of the fifth preferred embodiment shown in FIG. 7 will be described referring again to FIG. 6. When the input signal IN is at low level (Vss), the first PMOS transistor 512 is on state and the first NMOS transistor 514 is off state. All of the first to third nodes 528, 530 and 532 are at high level (Vcc). The second and third PMOS transistors 516 and 520 are off, while the second and third NMOS transistors 518 and 522 are on.

Next, when the input signal IN is changing low to high, the second node 530 is turned to low immediately or with a small period of delay, and as a result, the second NMOS transistor 518 is turned off and the second PMOS transistor 516 is turned on. After a certain period of delay time, the first and third nodes 528 and 532 are turned to low. When the first node 528 is turned to low, the PMOS transistor 520 is turned on and the NMOS transistor 522 is turned off. As a result, an output signal OUT at high level is outputted.

When the first node 528 is at an intermediate level, the PMOS and NMOS transistors 520 and 522 may be turned on at the same time. Even if the PMOS and NMOS transistors 520 and 522 are turned on simultaneously, no through-current or leak-current would be generated, because the NMOS transistor 518 has been turned off.

On the other hand, when the input signal IN is at high level (Vcc), the first PMOS transistor 512 is off state and the first NMOS transistor 514 is on state. All of the first to third nodes 528, 530 and 532 are at low level (Vss). The second and third PMOS transistors 516 and 520 are on, while the second and third NMOS transistors 518 and 522 are off.

Next, when the input signal IN is changing high to low, the first node 528 is turned to high immediately or with a small period of delay, and as a result, the NMOS transistor 522 is turned on and the PMOS transistor 520 is turned off. After a certain period of delay time, the second and third nodes 530 and 532 are turned to high. When the second node 530 is turned to high, the PMOS transistor 516 is turned off and the NMOS transistor 518 is turned on. As a result, an output signal OUT at low level is outputted.

When the second node 530 is at an intermediate level, the PMOS and NMOS transistors 516 and 518 may be turned on at the same time. Even if the PMOS and NMOS transistors 516 and 518 are turned on simultaneously, no through-current or leak-current would be generated, because the PMOS transistor 520 has been turned off.

Figure 8:
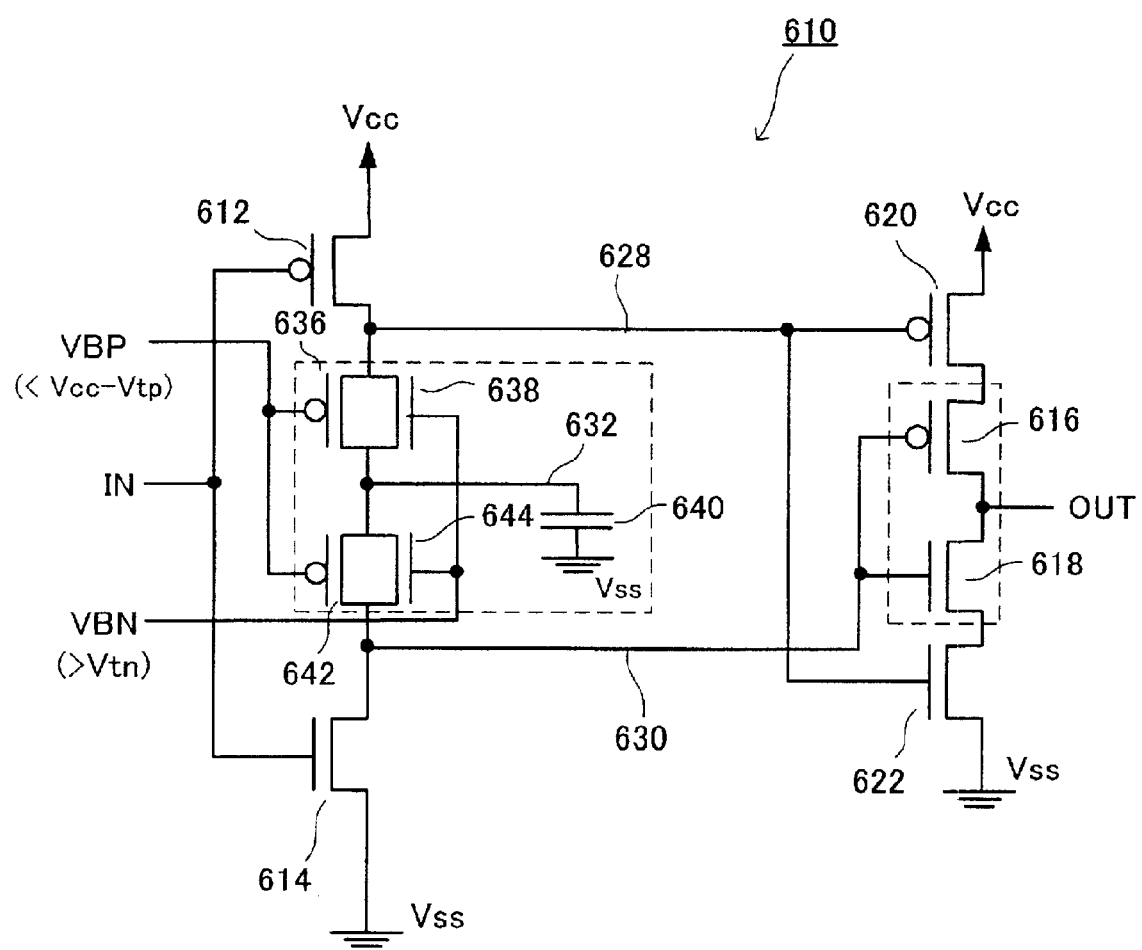
FIG. 8 is a circuit diagram showing a delay circuit according to a sixth preferred embodiment of the present invention.

FIG. 8 is a circuit diagram showing a delay circuit 610 according to a sixth preferred embodiment of the present invention. The delay circuit 610 includes an input circuit (612, 614); an output circuit (616, 618, 620, 622); a delay element (636, 638, 640, 642, 644); and first to third nodes 628, 630 and 632. As compared to the above-described first to third embodiments, the first node 628 functions as a delay node when an input signal IN is changing low to high, and as a non-delay node when the input signal IN is changing high to low. On the other hand, the second node 630 functions as a delay node when an input signal IN is changing high to low, and as a non-delay node when the input signal IN is changing low to high.

The first input circuit includes a first PMOS transistor 612 and a first NMOS transistor 614 to receive an input signal. The first PMOS transistor 612 and first NMOS transistor 614 function as an inverter. Gates of the first PMOS and first NMOS transistors 612 and 614 are supplied with an input signal IN. Drain and source of the first PMOS transistor 612 are connected to a first power supply source Vcc and the first node 628, respectively. Drain and source of the first NMOS transistor 614 are connected to the second node 630 and a second power supply source Vss, respectively.

The output circuit (616, 618, 620, 622) supplies an output signal OUT. The output circuit includes second and third PMOS transistors 616 and 620, and second and third NMOS transistor 618 and 622. The second PMOS transistor 616 and second NMOS transistor 618 form a first output element functioning as an inverter. The third PMOS transistor 620 and third NMOS transistor 622 form a second output element functioning as an inverter. Gates of the second PMOS and second NMOS transistors 616 and 618 are connected to the second node 630. A source of the second PMOS transistor 616 and a drain of the second NMOS transistor 618 are connected to an output terminal.

Gates of the third PMOS and third NMOS transistors 620 and 622 are connected to the first node 628. Drain and source of the third PMOS transistor 620 are connected to the first power supply source Vcc and a drain of the second PMOS transistor 616, respectively. Drain and source of the third NMOS transistor 622 are connected to a source of the second NMOS transistor 618 and the second power supply source Vss, respectively.

The delay element (636, 638, 640, 642, 644) is connected between the first node 628 and the second node 630 to generate a first control signal that is delayed with respect to the input signal IN. The delay element includes PMOS transistors 636 and 644, NMOS transistors 638 and 642 and a capacitor 640. The capacitor 640 is connected between the third node 632 and the second power supply source Vss. Gate, drain and source of the PMOS transistor 636 are connected to a third power supply source VBP, the first node 628 and third node 632, respectively. Gate, drain and source of the NMOS transistor 638 are connected to a fourth power supply source VBN, the first node 628 and third node 632, respectively. Gate, drain and source of the PMOS transistor 644 are connected to the third power supply source VBP, the third node 632 and second node 630, respectively. Gate, drain and source of the NMOS transistor 642 are connected to the fourth power supply source VBN, the third node 632 and second node 630, respectively.

The electric potential of the third power supply source VBP is lower than that of the first power supply source Vcc−Vtp, and electric potential of the fourth power supply source VBN is higher than that of the second power supply source Vss+Vtn.

Next, the operation of the sixth preferred embodiment shown in FIG. 8 will be described referring again to FIG. 6. When the input signal IN is at low level (Vss), the first PMOS transistor 612 is on state and the first NMOS transistor 614 is off state. All of the first to third nodes 628, 630 and 632 are at high level (Vcc). The second and third PMOS transistors 616 and 620 are off, while the second and third NMOS transistors 618 and 622 are on.

Next, when the input signal IN is changing low to high, the second node 630 is turned to low immediately or with a small period of delay, and as a result, the second NMOS transistor 618 is turned off and the second PMOS transistor 616 is turned on. After a certain period of delay time, the first and third nodes 628 and 632 are turned to low. When the first node 628 is turned to low, the PMOS transistor 620 is turned on and the NMOS transistor 622 is turned off. As a result, an output signal OUT at high level is outputted.

When the first node 628 is at an intermediate level, the PMOS and NMOS transistors 620 and 622 may be turned on at the same time. Even if the PMOS and NMOS transistors 620 and 622 are turned on simultaneously, no through-current or leak-current would be generated, because the NMOS transistor 618 has been turned off.

On the other hand, when the input signal IN is at high level (Vcc), the first PMOS transistor 612 is off state and the first NMOS transistor 614 is on state. All of the first to third nodes 628, 630 and 632 are at low level (Vss). The second and third PMOS transistors 616 and 620 are on, while the second and third NMOS transistors 618 and 622 are off.

Next, when the input signal IN is changing high to low, the first node 628 is turned to high immediately or with a small period of delay, and as a result, the NMOS transistor 622 is turned on and the PMOS transistor 620 is turned off. After a certain period of delay time, the second and third nodes 630 and 632 are turned to high. When the second node 630 is turned to high, the PMOS transistor 616 is turned off and the NMOS transistor 618 is turned on. As a result, an output signal OUT at low level is outputted.

When the second node 630 is at an intermediate level, the PMOS and NMOS transistors 616 and 618 may be turned on at the same time. Even if the PMOS and NMOS transistors 616 and 618 are turned on simultaneously, no through-current or leak-current would be generated, because the PMOS transistor 620 has been turned off.

According to the sixth preferred embodiment, driving voltage of the transistors 636, 638, 642 and 644 is lowered, and therefore, the transistors can be designed to be smaller in size. In the fifth and sixth preferred embodiments, although enhancement type of MOS transistors (636, 638, 642 and 644) are used, depression type of MOS transistors can be used instead.

What is claimed is:

1. A delay circuit, comprising:
    a first input circuit which receives an input signal;
    an output arrangement which comprises first and second output circuits to supply an output signal, the first and second output circuits being connected serially between a first power supply source and a second power supply source;
    a delay element, which is coupled to the output arrangement at a first node and coupled to the first input circuit at a second node, the delay element receiving from the second node a signal having substantially no delay with respect to the input signal and supplying, to the first node, a signal that is delayed with respect to the input signal,
    wherein the first input circuit comprises a P-type transistor and an N-type transistor connected serially between the first and second power supply sources,
    wherein the delay element is serially connected between the P-type transistor and N-type transistor in the input circuit,
    wherein the delay element comprises an N-type transistor, a gate of which is connected to a third power supply source, and a P-type transistor, a gate of which is connected to a fourth power supply source, and
    wherein electric potential of the third power supply source is lower than that of the first power supply source, and electric potential of the fourth power supply source is higher than that of the second power supply source.

2. A delay circuit, according to claim 1, wherein
    the first output circuit comprises a P-type transistor connected at a source to the output terminal, and an N-type transistor connected at a drain to the output terminal, and
    the second output circuit comprises a P-type transistor, a drain and source of which are connected to the first power supply source and a drain of the P-type transistor in the first output circuit; respectively; and an N-type transistor, a drain and source of which are connected to a source of the N-type transistor in the first output circuit and the second power supply source, respectively.

3. A delay circuit, according to claim 2, wherein
    the first node is connected to gates of the P-type and N-type transistors in the second output circuit, and
    the second node is connected to gates of the P-type and N-type transistors in the first output circuit.

4. A delay circuit, according to claim 1, wherein
    one of the first and second nodes is connected between the P-type transistor in the input circuit and the delay element, the other node is connected between the delay element and the N-type transistor in the input circuit.

5. A delay circuit, according to claim 1, wherein the delay element is coupled to the first input circuit at both the first and second nodes and is also connected to the output arrangement at both the first and second nodes.

6. A delay circuit, according to claim 1, wherein the P-type transistor and the N-type transistor of the delay element are connected to one another at an intermediate connection point, and wherein the delay element further comprises another P-type transistor that is connected to the intermediate connection point and another N-type transistor that is connected to the intermediate connection point, the gates of the P-type transistors of the delay element being connected to one another and the gates of the N-type transistors of the delay element being connected to one another.

7. A delay circuit, according to claim 6, wherein the delay element further comprises a capacitor that is connected to the intermediate connection point.

8. A semiconductor device, comprising:
    a delay circuit which comprises:
        a first input circuit which receives an input signal;
        an output arrangement which comprises first and second output circuits to supply an output signal, the first and second output circuits being connected serially between a first power supply source and a second power supply source; and a delay element, which is coupled to the output arrangement at a first node and coupled to the first input circuit at a second node, the delay element receiving from the second node a signal having substantially no delay with respect to the input signal and supplying, to the first node, a signal that is delayed with respect to the input signal;

wherein the first input circuit comprises a P-type transistor and an N-type transistor connected serially between the first and second power supply sources, and wherein the delay element is serially connected between the P-type transistor and N-type transistor in the input circuit, wherein the delay element comprises an N-type transistor, a gate of which is connected to a third power supply source, and a P-type transistor, a gate of which is connected to a fourth power supply source, and wherein electric potential of the third power supply source is lower than that of the first power supply source, and electric potential of the fourth power supply source is higher than that of the second power supply source.

9. A semiconductor device, according to claim 8, wherein the first output circuit comprises a P-type transistor connected at a source to the output terminal, and an N-type transistor connected at a drain to the output terminal, and the second output circuit comprises a P-type transistor, a drain and source of which are connected to the first power supply source and a drain of the P-type transistor in the first output circuit, respectively; and an N-type transistor, a drain and source of which are connected to a source of the N-type transistor in the first output circuit and the second power supply source, respectively.

10. A semiconductor device, according to claim 9, wherein the first node is connected to gates of the P-type and N-type transistors in the second output circuit, and the second node is connected to gates of the P-type and N-type transistors in the first output circuit.

11. A semiconductor device, according to claim 8, wherein one of the first and second nodes is connected between the P-type transistor in the input circuit and the delay element, the other node is connected between the delay element and the N-type transistor in the input circuit.

12. A delay circuit, according to claim 8, wherein the P-type transistor and the N-type transistor of the delay element are connected to one another at an intermediate connection point, and wherein the delay element further comprises another P-type transistor that is connected to the intermediate connection point and another N-type transistor that is connected to the intermediate connection point, the gates of the P-type transistors of the delay element being connected to one another and the gates of the N-type transistors of the delay element being connected to one another.

13. A delay circuit, according to claim 12, wherein the delay element further comprises a capacitor that is connected to the intermediate connection point.

* * * * *